(12) United States Patent
Tsai et al.

(10) Patent No.: US 11,762,041 B2
(45) Date of Patent: Sep. 19, 2023

(54) CONNECTOR DETECTING DEVICE AND RELATED SIGNAL DETECTING METHOD

(71) Applicant: Wistron Corporation, New Taipei (TW)

(72) Inventors: Chen-Chou Tsai, New Taipei (TW); Chiao-Pin Wang, New Taipei (TW); Guang-Zong Li, New Taipei (TW); Chung-Yu Lai, New Taipei (TW); I-Hsiu Tseng, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 17/728,995

(22) Filed: Apr. 26, 2022

(65) Prior Publication Data

US 2023/0213596 A1 Jul. 6, 2023

(30) Foreign Application Priority Data

Jan. 6, 2022 (TW) .................................. 111100579

(51) Int. Cl.
*G01R 31/68* (2020.01)
(52) U.S. Cl.
CPC .................................. *G01R 31/68* (2020.01)

(58) Field of Classification Search
CPC ...................................................... G01R 31/68
See application file for complete search history.

(56) References Cited

U.S. PATENT DOCUMENTS

| | | | | |
|---|---|---|---|---|
| 2004/0243348 A1* | 12/2004 | Minatani | ................ | G01R 31/68 702/183 |
| 2013/0327423 A1* | 12/2013 | Kanzaki | .............. | F16H 61/0251 137/487.5 |
| 2019/0162768 A1* | 5/2019 | Chandra | ................ | H01R 12/57 |
| 2022/0361380 A1* | 11/2022 | Heydari | ................ | H05K 7/208 |

FOREIGN PATENT DOCUMENTS

| | | | | |
|---|---|---|---|---|
| DE | 102011054394 A1 | * | 4/2013 | ........... G01R 19/155 |
| TW | M419923 U1 | | 1/2012 | |
| TW | 201723868 A | | 7/2017 | |
| TW | I743851 B | | 10/2021 | |

* cited by examiner

*Primary Examiner* — Christopher P McAndrew
*Assistant Examiner* — Zannatul Ferdous
(74) *Attorney, Agent, or Firm* — Winston Hsu (57) ABSTRACT

A connector detecting device for a connector includes a test vehicle, including a plurality of detecting points, to assemble with the connector; and a function module, formed an electrical connection with the test vehicle, configured to determine a conduction status between the connector and the test vehicle according to a loop of the plurality of detecting points and the connector.

18 Claims, 7 Drawing Sheets

CONNECTOR DETECTING DEVICE AND RELATED SIGNAL DETECTING METHOD

BACKGROUND OF THE INVENTION

1. Field of the Invention

The present invention relates to a connector detecting device and related signal detecting method, and more particularly, to a connector detecting device and related signal detecting method capable of thoroughly testing a connector.

2. Description of the Prior Art

With technique improvements of motherboard of servers and bus standards, the transmission speed and bandwidth are increased, and demands of the stability of a connector for connecting the motherboard of servers are increased. A conventional testing machine for testing the connector of the motherboard and the external card cannot determine or analyze a connection status during the testing process, and can only determine whether the connector can be normally operated after the testing. More specifically, the connector of the motherboard may be a peripheral component interconnect (PCIe) socket of the motherboard for electrically connecting the PCIe card. However, the conventional testing for the PCIe socket may only test or examine partial structure or surface of the PCIe socket, e.g. partial damage or deformation of the PCIe socket, which cannot ensure that whether the PCIe socket is normally functional or not, and cannot provide any information or records obtained during the testing for subsequent evaluations, output related signals and perform the evaluation with external data processing equipment.

Under such condition of unable to determine the quality of PCIe socket and unable to provide any testing data, problems cannot be solved when the connection between the PCIe card and the PCIe socket is abnormal or the PCIe card cannot be read, which causes the inconveniences to the manufacturers and users.

Therefore, improvements are necessary to the conventional technique.

SUMMARY OF THE INVENTION

In light of this, the present invention provides a connector detecting device and related signal detecting method to thoroughly test a connector of an external card of a computer system.

An embodiment of the present invention provides a connector detecting device for a connector, comprises a test vehicle, including a plurality of detecting points, to assemble with the connector; and a function module, formed an electrical connection with the test vehicle, configured to determine a conduction status between the connector and the test vehicle according to a loop of the plurality of detecting points and the connector.

Another embodiment of the present invention provides a signal detecting method of a connector detecting device, wherein the connector detecting device includes a function module a test vehicle and a support kit, and the signal detecting method comprises electrically connecting the connector detecting device to a connector; and determining a conduction status between the connector and the test vehicle according to a loop of the plurality of detecting points and the connector.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
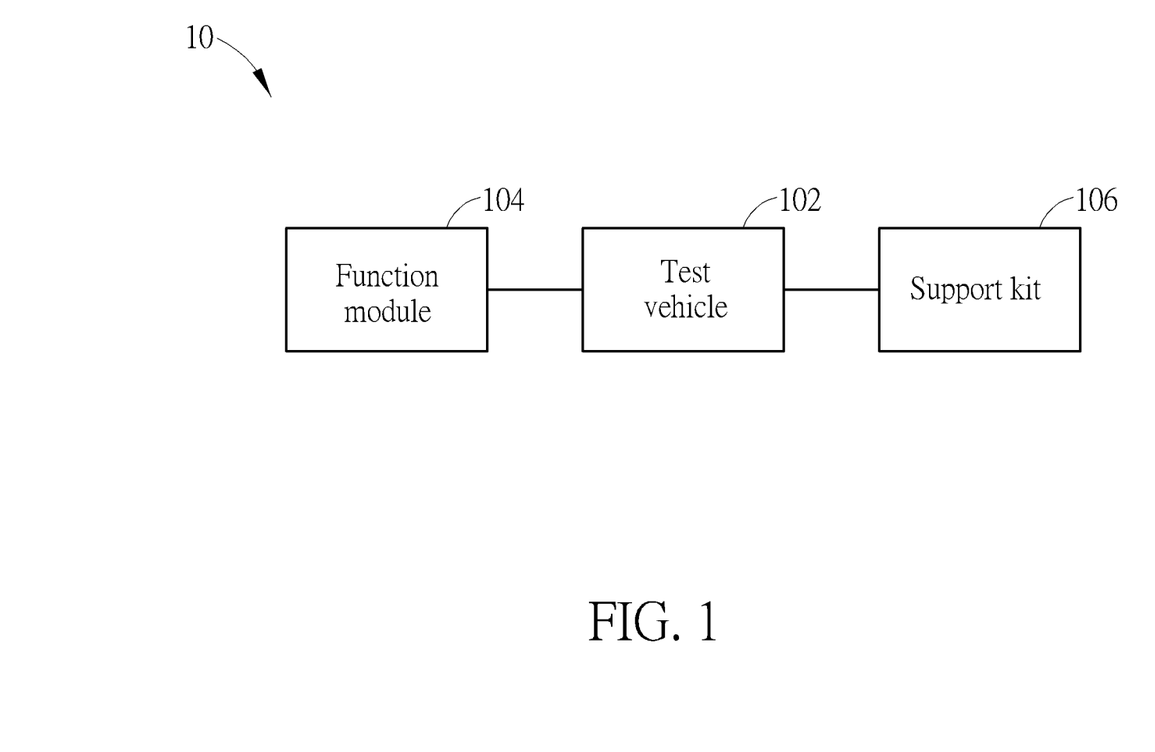
FIG. 1 is a schematic diagram of a connector detecting device according to an embodiment of the present invention.

Refer to FIG. 1, which is a schematic diagram of a connector detecting device 10 according to an embodiment of the present invention. The connector detecting device 10 is utilized for detecting a conduction status of a connector SD. The connector SD may be a socket connected to an external card, e.g. the external card may be a printed circuit board (PCB), a peripheral component interconnect (PCIe) card or a dual in-line memory module (DIMM), and the connector SD may be the socket for electrically connecting the PCB, the PCIe card or the DIMM. The connector detecting device 10 includes a test vehicle 102, a function module 104 and a support kit 106. The test vehicle 102 may be an external card including a plurality of detecting points for assembling with the connector SD. The function module 104 may be electrically connected to the test vehicle 102, and is configured to determine the conduction status between the test vehicle 102 and the connector SD according to a loop of the connector SD and the detecting points of the test vehicle 102. Therefore, the connector detecting device 10 according to an embodiment of the present invention may detect the conduction status between the connector SD and the test vehicle 102 during a testing period of an electronic product with the connector SD to determine quality of the connector SD.

Figure 2:
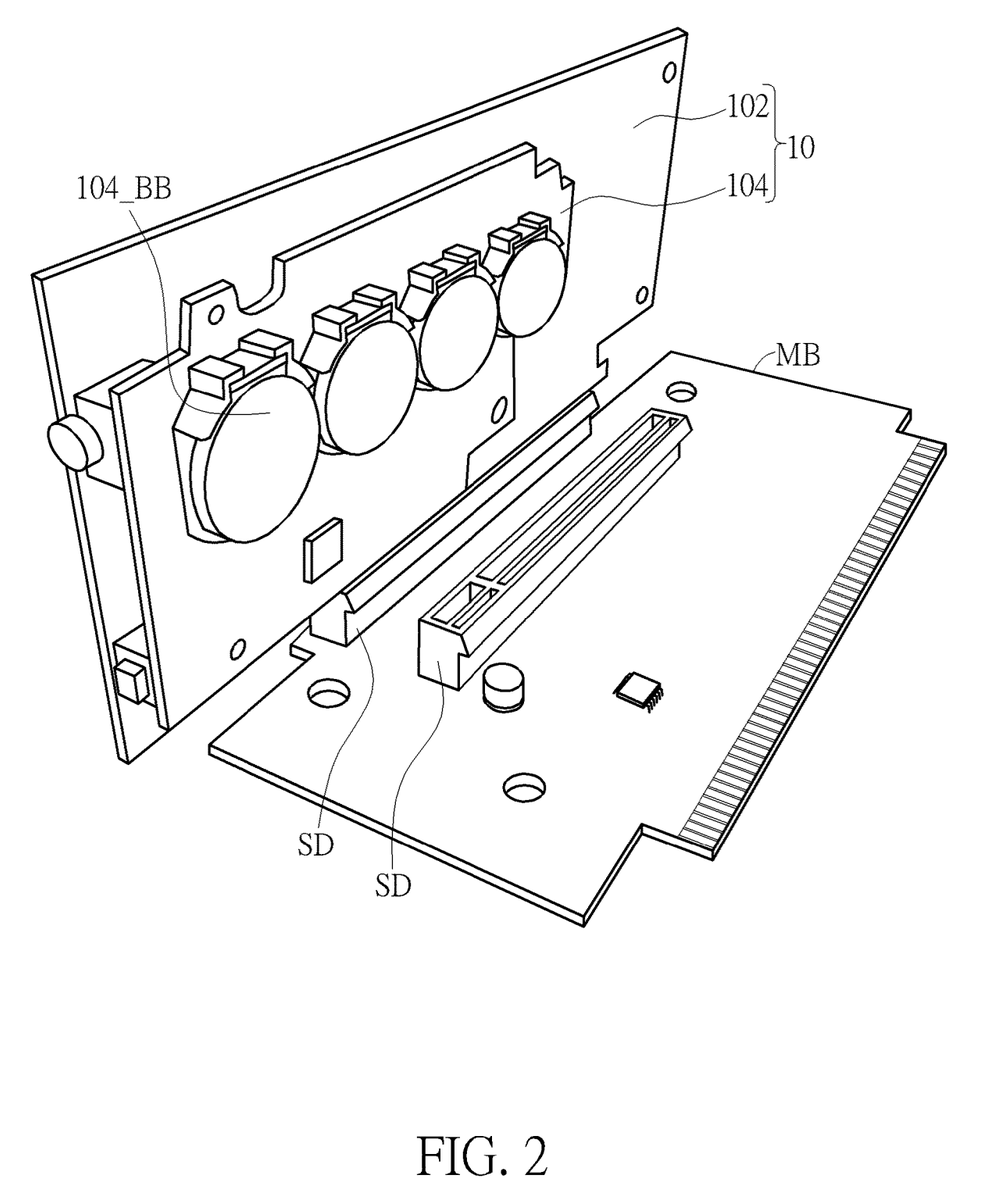
FIG. 2 is a schematic diagram of an assembly of the connector detecting device and a connector according to an embodiment of the present invention.

Refer to FIG. 2, which is a schematic diagram of an assembly of the connector detecting device 10 and the connector SD according to an embodiment of the present invention. In the embodiment of FIG. 2, the connector SD is disposed on a motherboard MB. Since the test vehicle 102 includes multiple golden fingers, the connector detecting device 10 according to an embodiment of the present invention determines whether a connection between the test vehicle 102 and a computer system is broken or not according to the signals between the connector SD and one or more the golden fingers of the test vehicle 102, such that the conduction status between the connector SD and the test vehicle 102 is determined. For example, when the function module 104 detects that signal disconnects between the test vehicle 102 and the connector SD, the function module 104 outputs a disconnection signal to the computer system and records disconnected detecting points, occurrence time, frequency and related details.

In this way, the function module 104 according to an embodiment of the present invention may thoroughly examine the quality of the connector SD during the testing period of the electronic product according to the conduction status between the connector SD and the test vehicle 102.

Figure 3:
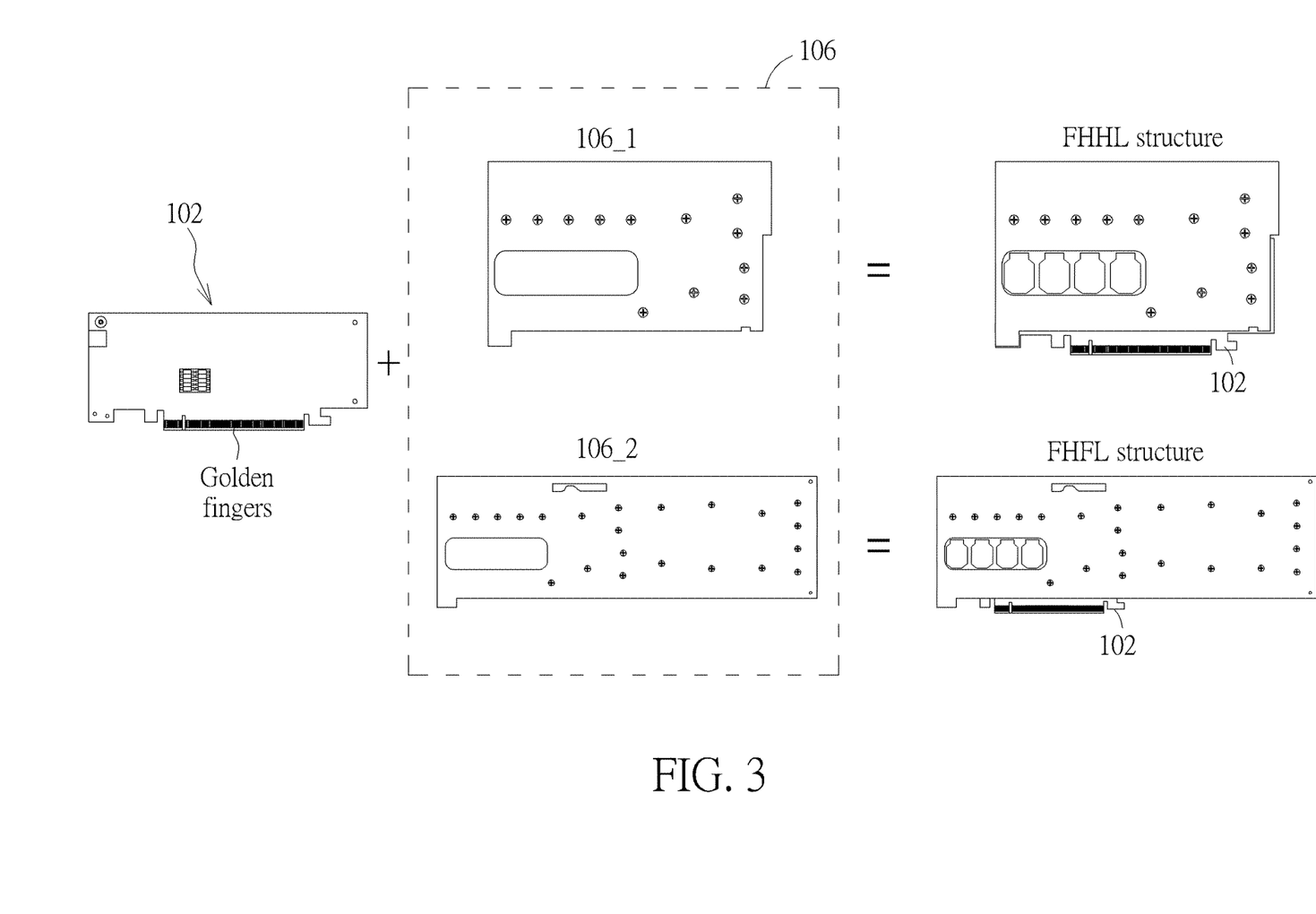
FIG. 3 is a schematic diagram of a test vehicle according to an embodiment of the present invention.

In an embodiment, when the test vehicle 102 is a PCIe card, in order to allocate least circuitry elements on the test vehicle 102 to decrease loss of the golden fingers of the test vehicle 102, a structure of the test vehicle 102 may be implemented as shown in FIG. 3, but not limited thereto.

In an embodiment, the function module 104 includes a connecting plug, the test vehicle 102 includes a connecting socket, and the connecting plug of the function module 104 is pluggable to electrically connect the connecting socket of test vehicle 102. In addition, after the function module 104 is electrically connected to the test vehicle 102, the function module 104 may further include a locking structure for locking the function module 104 on the test vehicle 102.

In FIG. 3, the support kit 106 may have a containing space (not shown in the figure), the test vehicle 102 and the function module 104 may be accommodated to the containing space of the support kit 106, e.g. a first type support kit 106_1 or a second type support kit 106_2, to implement a full-height-half-length (FHHL) structure or a full-height-full-length (FHFL) structure, such that the test vehicle 102 may be transformed into different structures or different sizes.

Moreover, the support kit 106 according to an embodiment of the present invention may be allocated with at least a sensor or at least a counterweight, such that experiments may be performed by the support kit 106 with multiple counterweights and sensing signals of the accelerators. As such, the conduction status between the connector SD and the test vehicle 102 may be detected and different situations of the disconnections may be recorded and analyzed.

Figure 4:
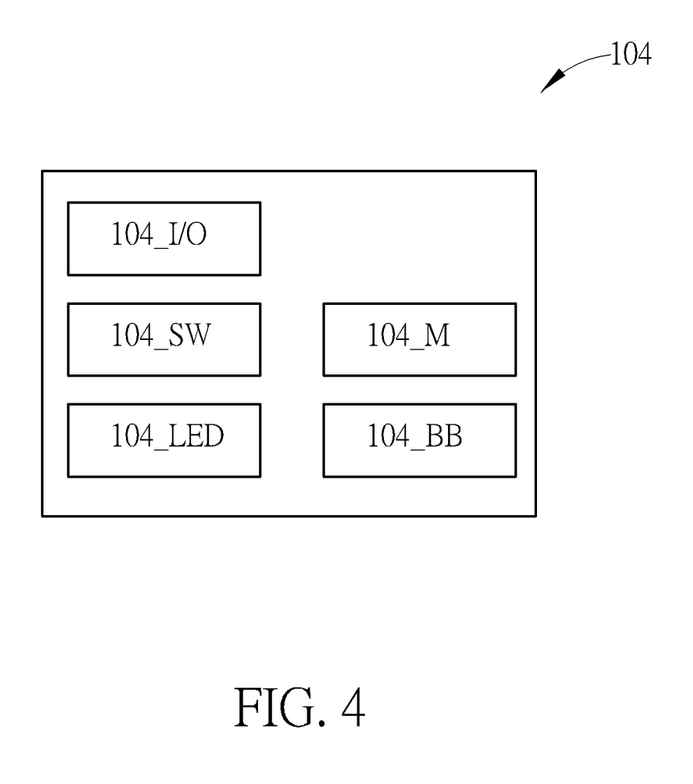
FIG. 4 is a schematic diagram of a function module according to another embodiment of the present invention.

Refer to FIG. 4, which is a schematic diagram of the function module 104 according to another embodiment of the present invention. The function module 104 includes a memory device 104_M, an input/output module 104_I/O, a state display device 104_LED, a power switch 104_SW and a battery module 104_BB. The memory device 104_M is configured to store the conduction status between the test vehicle 102 and the computer system, e.g. when the connector detecting device 10 detects that the test vehicle 102 is disconnected with the connector SD, the sensing signals sensed by the accelerator of the connector detecting device 10, the occurrence time and disconnected detecting points may be stored in the memory device 104_M. In addition, the memory device 104_M may be utilized for storing related information of the PCIe card of the test vehicle 102.

The input/output module 104_I/O is configured to read and erase information of the memory device 104_M and to transmit the conduction status between the test vehicle 102 and the connector SD in real-time. In an embodiment, the function module 104 transmits the conduction status between the test vehicle 102 and the connector SD, and a sensing result of the sensor, e.g. analog signals of the sensing results sensed by the accelerator, to the computer system via a first input/output port of the input/output module 104_I/O. On the other hand, the function module 104 may read and erase digital data of the memory device 104_M via a second input/output of the input/output module 104_I/O. Notably, the first input/output port is different with the second input/output port for inputting/outputting different types of information.

The state display device 104_LED is configured to display the corresponding conduction status of the test vehicle 102. In an embodiment, the state display device 104_LED may display the disconnection, the connection or a power on/off state of the test vehicle 102 via a visual way, e.g. multiple light-emitting diodes (LED). The battery module 104_BB is configured to provide power to the connector detecting device 10. In an embodiment, the battery module 104_BB may be a button battery for providing the power source, but not limited thereto. The power switch 104_SW is configured to turn on or turn off the power source of the connector detecting device 10.

In addition, the function module 104 may not only output the signal referring to the conduction status of the test vehicle 102 and the connector SD to the computer system, but also integrate and transmit the sensing signals sensed by the sensor of the support kit 106 to the computer system for analysis. Alternatively, sensors with other functions may be implemented on the support kit 106 for providing related detecting signals to the computer system for determination and analysis.

Figure 5:
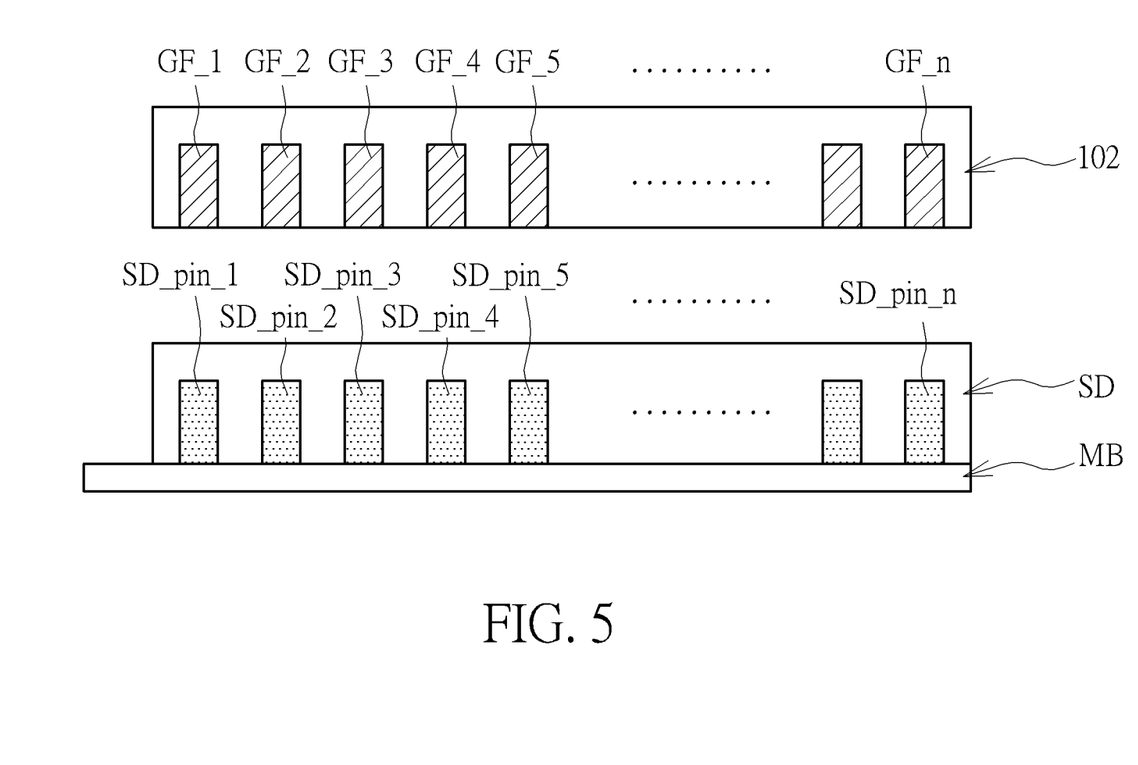
FIG. 5 is a schematic diagram of a side view of the test vehicle and the connector according to another embodiment of the present invention.
Figure 6:
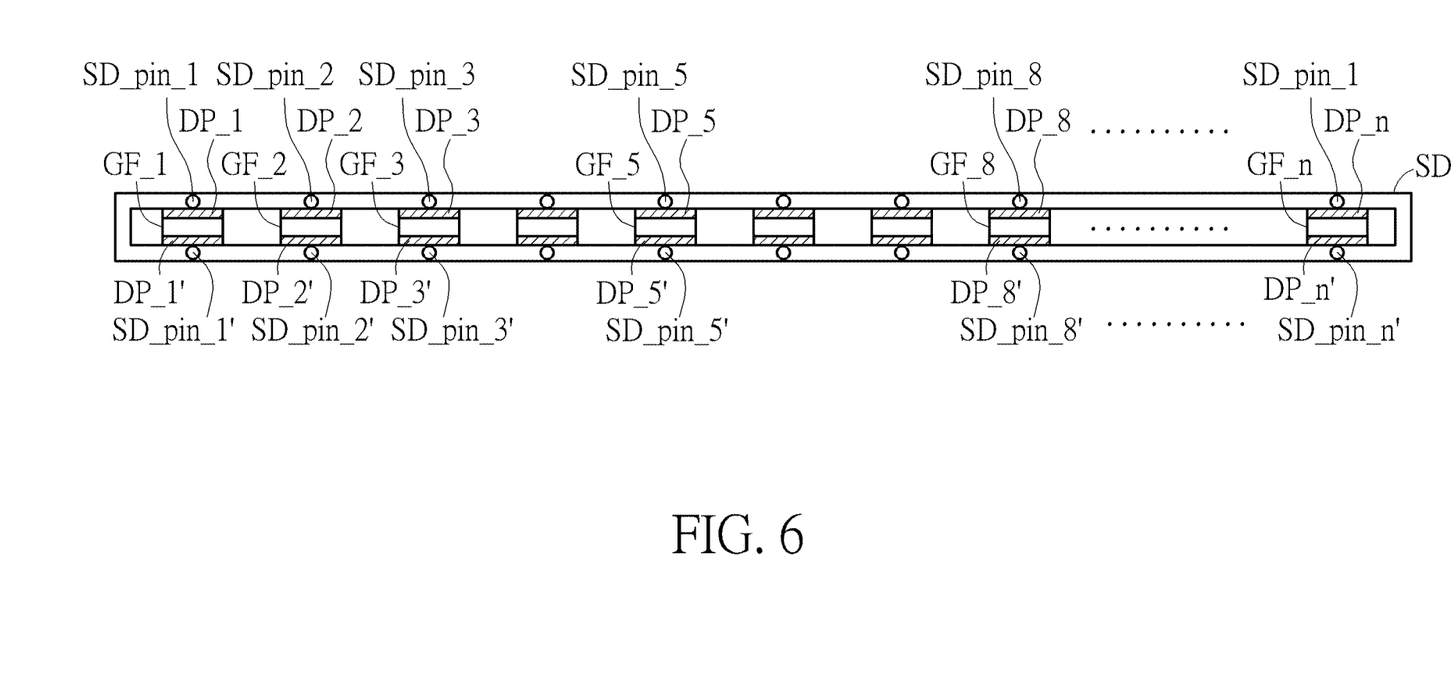
FIG. 6 is a schematic diagram of a top view of the assembly of the connector detecting device and the connector according to another embodiment of the present invention.

Refer to FIGS. 5 and 6 for the function module 104 detecting the conduction status between the test vehicle 102 and the connector SD. FIG. 5 is a schematic diagram of a side view of the test vehicle 102 and the connector SD according to another embodiment of the present invention; FIG. 6 is a schematic diagram of a top view of the assembly of the test vehicle 102 and the connector SD according to another embodiment of the present invention. When the test vehicle 102 is the PCIe card, the connector SD is the socket, the connector SD is electrically connect to detecting points DP_1-DP_n, DP_1'-DP_n' on both sides of golden fingers GF_1-GF_n on the PCIe card via multiple connecting pins SD_pin_1-SD_pin_n, SD_pin_1'-SD_pin_n'. Notably, areas of the detecting points DP_1-DP_n, DP_1'-DP_n' illustrated in FIG. 6 are for indicating both sides of the golden fingers, but not for limiting appearances or elements of the detecting points.

In normal situations, when the connector detecting device 10 is powered on, the battery module 104_BB provides the power source. When the test vehicle 102 is inserted to the connector SD and electrically connected to the connector SD, i.e. the golden fingers GF_1-GF_n are respectively electrically connected to the connecting pins SD_pin_1-SD_pin_n, SD_pin_1'-SD_pin_n', the connector detecting device 10 may determine the conduction status between the test vehicle 102 and the connector SD according to the loop formed by any two detecting points of the golden fingers GF_1-GF_n and corresponding connecting pins. In an embodiment, the connector detecting device 10 may determine the conduction status between the test vehicle 102 and the connector SD according to the loops of the detecting points DP_1, DP_3, DP_5, DP_8, DP_1', DP_3', DP_5', DP_8' on both sides of the golden fingers GF_1, GF_3, GF_5, GF_8 and the connecting pins SD_pin_1, SD_pin_3, SD_pin_5, SD_pin_8, SD_pin_1', SD_pin_3', SD_pin_5', SD_pin_8'. In this way, the connector detecting device 10 according to an embodiment of the present invention may detect the conduction status between the test vehicle 102 and the connector SD according to the loops formed by the battery module 104_BB, the golden fingers GF_1-GF_n of the connector detecting device 10 and the connecting pins SD_pin_1-SD_pin_n, SD_pin_1'-SD_pin_n'.

Notably, when the computer system is powered off, the battery module 104_BB may provide the power source for the connector detecting device 10, such that the connector detecting device 10 may detect the conduction status between the test vehicle 102 and the connector SD according to the loops formed by the battery module 104_BB, the golden fingers GF_1-GF_n of the connector detecting device 10 and the connecting pins SD_pin_1-SD_pin_n, SD_pin_1'-SD_pin_n'.

On the other hand, when any one of the detecting points of the golden fingers GF_1-GF_n of the connector detecting device 10 is detached, i.e. one or more connecting pins SD_pin_n-SD_pin_n, SD_pin_1'-SD_pin_n' of the connector SD are detached from corresponding golden fingers GF_1-GF_n, the loop cannot be formed, and the connector detecting device 10 may detect partial disconnection(s) between the test vehicle 102 and the connector SD, and transmit the corresponding disconnection signal to the computer system. The function module 104 of the connector detecting device 10 may integrate the disconnection signal with other sensing signals of the sensors implemented on the support kit 106, and then transmit the signals to the computer system via the first input/output port of the input/output module 104_I/O, such that the computer system may perform analysis and determination according to the signals. Therefore, the connector detecting device 10 may display the determination result via the state display device 104_LED according to the determination of the function module 104 with different colors or light combinations and store the corresponding determination in the memory device 104_M.

Figure 7:
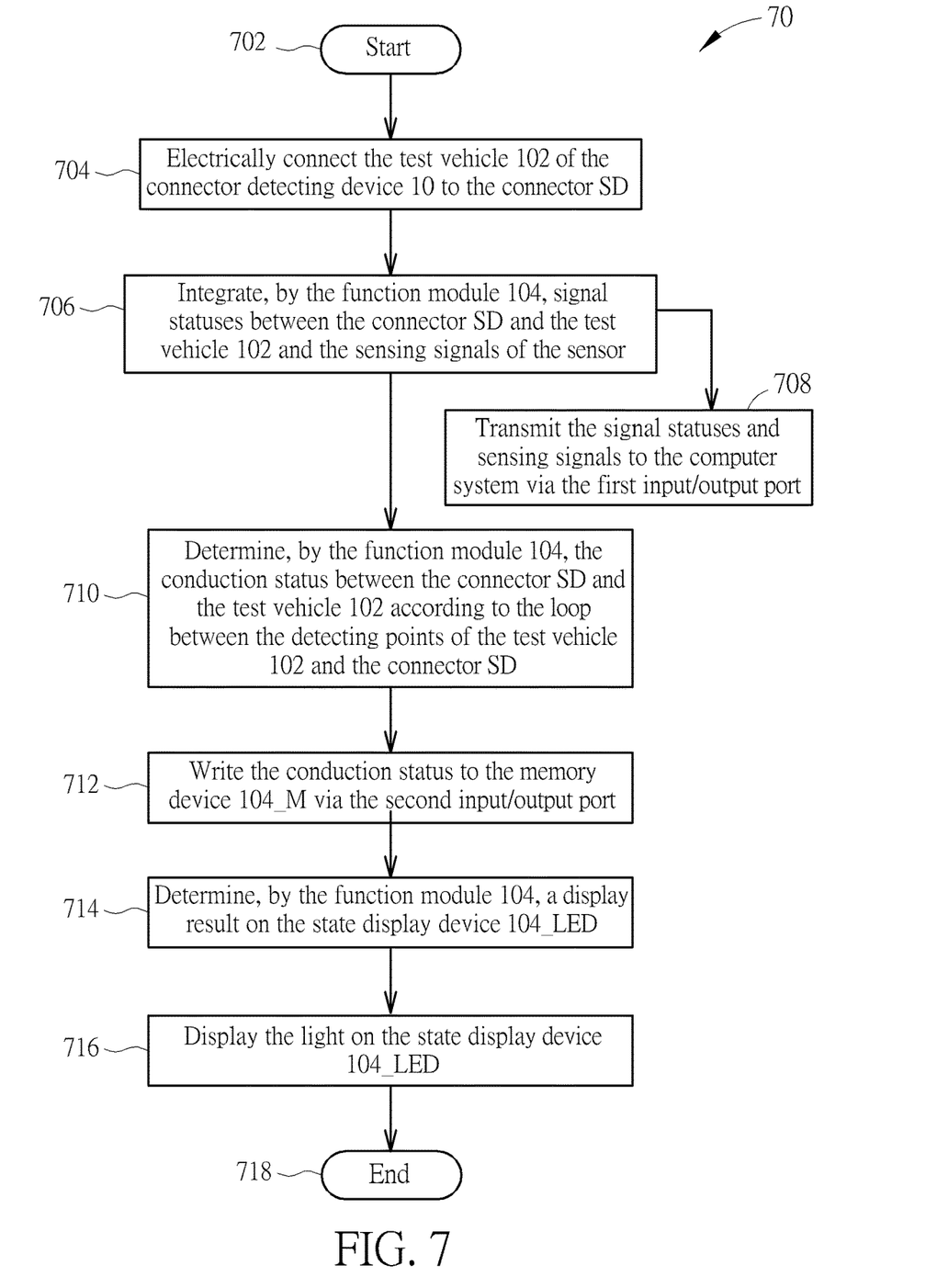
FIG. 7 is a schematic diagram of a signal detecting method according to another embodiment of the present invention.

A signal detecting method 70 of the connector detecting device 10 may be summarized, as shown in FIG. 7. The signal detecting method 70 includes the following steps:

Step 702: Start.

Step 704: Electrically connect the test vehicle 102 of the connector detecting device 10 to the connector SD;

Step 706: Integrate, by the function module 104, signal statuses between the connector SD and the test vehicle 102 and the sensing signals of the sensor;

Step 708: Transmit the signal statuses and sensing signals to the computer system via the first input/output port;

Step 710: Determine, by the function module 104, the conduction status between the connector SD and the test vehicle 102 according to the loop between the detecting points of the test vehicle 102 and the connector SD;

Step 712: Write the conduction status to the memory device 104_M via the second input/output port;

Step 714: Determine, by the function module 104, a display result on the state display device 104_LED;

Step 716: Display the light on the state display device 104_LED;

Step 718: End.

Further details about the operation method of the signal detecting method 70 can be known by referring to the embodiments of the embodiments of the connector detecting device 10 above, and are therefore not narrated here for brevity.

Notably, those skilled in the art may properly design the connector detecting device according to different system requirements. For example, a number of the golden fingers of the test vehicle 102, a number of the detecting points, a number of the support kits, and a number and allocation of the input/output module, may all be adjusted according to different system requirements, and not limited thereto.

In summary, the present invention provides a connector detecting device and related signal detecting method, which thoroughly tests the connector and detects whether abnormal situations happen or not according to a connection status between the connector and a test vehicle for complete analysis to solve disadvantages of conventional testing machines.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A connector detecting device for a connector, comprising:
   a test vehicle, including a plurality of detecting points, to assemble with the connector and form a loop of the detecting points with the connector; and
   a function module, formed an electrical connection with the test vehicle, configured to determine a conduction status between the connector and the test vehicle according to the loop of the plurality of detecting points and the connector;
   wherein the function module of the connector detecting device is detachable to the test vehicle;
   wherein the loop is a circuit loop connecting the detecting points and the connector.

2. The connector detecting device of claim 1, further comprising:
   a support kit, allocated with at least a sensor or at least a counterweight, wherein the support kit has a containing space which is configured to accommodate the test vehicle and the function module.

3. The connector detecting device of claim 1, wherein the function module comprises:
   a memory device, configured to store the conduction status between the test vehicle and the connector;
   an input/output module, configured to read and erase the memory device and to transmit the conduction status in real-time;
   a state display device, configured to display corresponding conduction status; and
   a power switch, configured to turn on or turn off a power source of the connector detecting device.

4. The connector detecting device of claim 3, wherein the function module is configured to transmit the conduction status and a sensing result of the at least a sensor to a computer system via a first input/output port of the input/output module.

5. The connector detecting device of claim 3, wherein the function module reads or erases the memory device via a second input/output port of the input/output module.

6. The connector detecting device of claim 1, wherein the test vehicle is a peripheral component interconnect express (PCIe) card or a dual in-line memory module (DIMM).

7. The connector detecting device of claim 1, wherein the function module includes at least a connecting plug, the test vehicle includes at least a connecting socket, and the connecting plug is pluggable to electrically connect the connecting socket.

8. The connector detecting device of claim 1, further comprising:
   a battery module, configured to provide a power source to the connector detecting device.

9. The connector detecting device of claim 8, wherein the function module is configured to determine the conduction status of the loop between the test vehicle and the connector, according to the power from the battery module, the plurality of detecting points of the test vehicle and the connector.

10. A signal detecting method of a connector detecting device, wherein the connector detecting device includes a function module a test vehicle and a support kit, and the signal detecting method comprising:
electrically connecting the connector detecting device to a connector and forming a loop of the detecting points with the connector; and
determining a conduction status between the connector and the test vehicle according to the loop of the plurality of detecting points and the connector;
wherein the function module of the connector detecting device is detachable to the test vehicle;
wherein the loop is a circuit loop connecting the detecting points and the connector.

11. The signal detecting method of claim 10, wherein the support kit is allocated with at least a sensor or at least a counterweight, wherein the support kit has a containing space which is configured to accommodate the test vehicle and the function module.

12. The signal detecting method of claim 10, wherein a memory device of the function module is configured to store the conduction status between the test vehicle and the connector; an input/output module of the function module is configured to read and erase the memory device and to transmit the conduction status in real-time; a state display device of the function module is configured to display corresponding conduction status; and a power switch of the function module is configured to turn on or turn off a power source of the connector detecting device.

13. The signal detecting method of claim 12, wherein the function module is configured to transmit the conduction status and a sensing result of at least a sensor to a computer system via a first input/output port of the input/output module.

14. The signal detecting method of claim 12, wherein the function module reads or erases the memory device via a second input/output port of the input/output module.

15. The signal detecting method of claim 10, wherein the test vehicle is a peripheral component interconnect express (PCIe) card or a dual in-line memory module (DIMM).

16. The signal detecting method of claim 10, wherein the function module includes at least a connecting plug, the test vehicle includes at least a connecting socket, and the connecting plug is pluggable to electrically connect the connecting socket.

17. The signal detecting method of claim 10, further comprising a battery module, and the battery module is configured to provide a power source to the connector detecting device.

18. The signal detecting method of claim 17, wherein the function module is configured to determine the conduction status between the test vehicle and the connector according to the loop of the battery module, the plurality of detecting points of the test vehicle and the connector.

* * * * *